United States Patent
Choi et al.

(10) Patent No.: US 11,545,966 B2
(45) Date of Patent: Jan. 3, 2023

(54) INJECTION LOCKING OSCILLATOR CIRCUIT AND OPERATING METHOD

(71) Applicant: SAMSUNG ELECTRONICS CO., LTD., Suwon-si (KR)

(72) Inventors: Young Choi, Hwaseong-si (KR); Wonjoo Jung, Bucheon-si (KR); Youngchul Cho, Seongnam-si (KR); Youngdon Choi, Seoul (KR); Junghwan Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/224,577

(22) Filed: Apr. 7, 2021

(65) Prior Publication Data

US 2022/0069812 A1    Mar. 3, 2022

(30) Foreign Application Priority Data

Sep. 2, 2020 (KR) ..................... 10-2020-0111679

(51) Int. Cl.
*H03B 27/00* (2006.01)
*H03K 5/01* (2006.01)

(52) U.S. Cl.
CPC ..................... *H03K 5/01* (2013.01)

(58) Field of Classification Search
CPC ........ H03K 5/01; H03K 3/0315; H03K 3/013; H03B 2200/0074
USPC .......................................................... 331/45
See application file for complete search history.

(56) References Cited

U.S. PATENT DOCUMENTS

| | | | |
|---|---|---|---|
| 7,612,621 B2* | 11/2009 | Kim | ......................... H03K 5/13 331/74 |
| 8,004,335 B2* | 8/2011 | Kim | ...................... H03B 27/00 327/231 |
| 8,624,645 B2 | 1/2014 | Ma | |
| 9,444,435 B1 | 9/2016 | Monaco et al. | |
| 9,473,129 B2* | 10/2016 | Luo | ...................... H03K 5/131 |
| 9,755,574 B2 | 9/2017 | Chatwin | |
| 9,768,759 B2 | 9/2017 | Tanihira | |
| 10,476,434 B1 | 11/2019 | Pandita et al. | |
| 10,536,151 B1 | 1/2020 | Zhou et al. | |
| 10,566,958 B1 | 2/2020 | Song et al. | |
| 11,183,993 B2* | 11/2021 | Shin | ......................... G06F 1/06 |
| 2007/0090867 A1* | 4/2007 | Kim | ...................... H03K 5/133 327/291 |
| 2017/0366195 A1* | 12/2017 | Kim | ..................... H03K 3/0322 |

FOREIGN PATENT DOCUMENTS

JP        2011199590 A    10/2011

* cited by examiner

*Primary Examiner* — Ryan Jager
(74) *Attorney, Agent, or Firm* — Volentine, Whitt & Francos, PLLC

(57) ABSTRACT

An injection locking oscillator (ILO) circuit includes; an injection circuit that receives input signals having a phase difference and provides injection signals respectively corresponding to the input signals based on a voltage level difference between each input signal and an oscillation signal at an output terminal, and a poly-phase signal output circuit that provides poly-phased signals having a phase difference between signals fixed to a defined phase difference upon receiving the injection signals from the input terminals.

17 Claims, 14 Drawing Sheets

INJECTION LOCKING OSCILLATOR CIRCUIT AND OPERATING METHOD

CROSS-REFERENCE TO RELATED APPLICATION

This application claims priority under 35 U.S.C. § 119 to Korean Patent Application No. 10-2020-0111679 filed on Sep. 2, 2020 in the Korean Intellectual Property Office, the subject matter of which is hereby incorporated by reference.

BACKGROUND

The inventive concept relates generally to injection locking oscillator (ILO) circuits and operating methods for ILOs.

When a memory device including, for example, double data rate synchronous dynamic random access memory (DR SDRAM), receives an external clock and generates an internal clock based on the external clock, the memory device may generate an internal clock using two signals having a quadrature phase difference. In such applications, it is essential that signals having an accurate quadrature phase difference be applied to the memory device.

When the memory device generates an internal clock, the memory device may reduce power consumption and remove a jitter component of an external clock and skew component(s) among various signals associated with an ILO. Thus, an ILO may synchronize oscillation signals of an internal oscillator in relation to signals injected from an external source, and may accurately adjust a phase difference among the injection signals by removing skew components from the injection signals in relation to the synchronized oscillation signals.

SUMMARY

Embodiments of the inventive concept provide efficient injection locking oscillator (ILO) circuits capable of removing noise that may arise in an oscillation signal when a toggle signal is injected as an input signal.

According to an aspect of the inventive concept, there is provided an injection locking oscillator (ILO) circuit including; an injection circuit configured to receive input signals having a phase difference relative between the input signals and provide injection signals respectively corresponding to the input signals based on a voltage level difference between each input signal and an oscillation signal, and a poly-phase signal output circuit configured to output poly-phase output signals having a defined phase difference between the output signals in response to the injection signals.

According to an aspect of the inventive concept, there is provided a quadrature skew compensation circuit including; a quadrature oscillator configured to generate oscillation signals having different phases and respectively provide the oscillation signals at nodes, such that each node provides an oscillation signal orthogonal to a different oscillation signal provided at a neighboring node, and an injection circuit configured to receive input signals respectively corresponding to the nodes and output injection signals to the respective nodes based on a voltage level difference between the oscillation signal of each node and the input signals.

According to an aspect of the inventive concept, there is provided an operating method for an injection locking oscillator (ILO). The operating method includes; injecting an injection signal to a first node based on a voltage level difference between an input signal corresponding to the first node and an oscillation signal generated in the first node; synthesizing the oscillation signal with the injection signal in the first node, and outputting, from the first node, a signal having a fixed quadrature phase difference with respect to neighboring nodes of the first node based on a signal provided by synthesizing the oscillation signal with the injection signal.

BRIEF DESCRIPTION OF THE DRAWINGS

Embodiments of the inventive concept will be more clearly understood from the following detailed description taken in conjunction with the accompanying drawings in which.

DETAILED DESCRIPTION

Embodiments of the inventive concept will now be described in some additional detail with reference to the attached drawings. Throughout the written description and drawings, like reference numbers and labels will be used to denote like or similar elements, features and steps.

Figure 1:
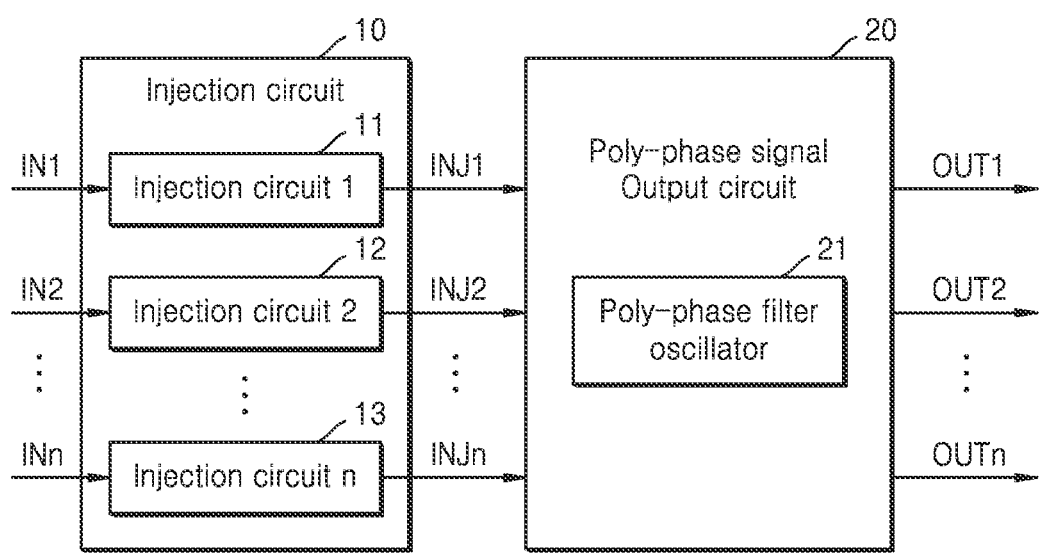
FIG. 1 is a block diagram illustrating an injection locking oscillator circuit according to embodiments of the inventive concept.

Figure (FIG. 1 is a block diagram illustrating an injection locking oscillator (ILO) circuit according to embodiments of the inventive concept.

Here, the ILO circuit may generally include an injection circuit 10 and a poly-phase signal output circuit 20. The injection circuit 10 may output injection signals (e.g., INJ1 through INJn) respectively in response to (or based on) input signals (e.g., IN1 through INn) received from an external source. The poly-phase signal output circuit 20 may generate at least one output signal (e.g., OUT1 through OUTn) in response to the injection signals received from the injection circuit 10.

In some embodiments like the one illustrated in FIG. 1, the injection circuit 10 of the ILO circuit may include multiple injection circuits (e.g., injection circuit 1 through injection circuit 'n') corresponding to a number of input nodes of the poly-phase signal output circuit 20. For example, assuming that the poly-phase signal output circuit 20 includes a quadrature oscillator generating oscillation signals that are respectively orthogonal to neighboring nodes, the ILO circuit may include four injection circuits corresponding to four input nodes. Thus, first, second and third input signals IN1, IN2, and IN3 may be input to the injection circuit 10 as signals having a same frequency and a constant, relative phase difference with respect to one another. Here, however, the phase difference among the input signals IN1, IN2, and IN3 may include a skew, and may therefore result in inaccurate input signals.

In the illustrated example of FIG. 1, the injection circuits 11, 12, and 13 may be used to generate respective injection signals (e.g., INJ1, INJ1 and INJn) based on respective input signals (e.g., IN1, IN2, and IN3) characterized by a voltage difference between each of the input signals and an oscillation signal. Thus, the first injection circuit 11 may generate a first injection signal INJ1 based on a difference between a first oscillation signal generated at a first input node of the poly-phase signal output circuit 20 corresponding to the first injection circuit 11 and a first input signal IN1 applied to the first injection circuit 11. That is, the first injection circuit 11 may provide the generated first injection signal INJ1 to the first input node. Similarly, all of the injection circuits 10 may provide respective injection signals through associated with a difference between a corresponding input signal and an oscillation signal to the poly-phase signal output circuit 20.

As a result, the poly-phase signal output circuit 20 may receive a respective injection signal at each node, and synchronize frequencies and phases of the injection signal and the oscillation signal by synthesizing the injection signal with the oscillation signal.

In some embodiments, the poly-phase signal output circuit 20 may include a poly-phase filter (PPF) oscillator 21, wherein the poly-phase filter oscillator 21 may generate oscillation signals having a phase difference among neighboring nodes. For example, when the poly-phase filter oscillator 21 is assumed to be a quadrature oscillator, each of four nodes may maintain an accurate quadrature phase difference with respective neighboring nodes. Oscillation signals oscillating with a quadrature phase difference with respect to neighboring nodes may be synthesized with an injection signal input to each node, and a signal obtained by synthesizing in each node may maintain a quadrature phase difference with respect to their neighboring node.

Thus, the poly-phase signal output circuit 20 may provide poly-phase output signals (e.g., OUT1 through OUTn) based on an oscillation signal and a phase difference that is fixed with respect to neighboring nodes for each node. The output signals may be generated based on signals synthesized in the poly-phase filter oscillator 21, and thus, may be output signals, wherein a phase difference is maintained between each output signal and output signals at neighboring nodes. In some embodiments, the output signals generated based on synthesized signals may be those whereby the synthesized signals are output without any change, but they are not limited thereto, and may also be toggle signals, a defined phase difference of which is maintained.

Assuming the application of an externally-supplied toggle signal as an input signal, the ILO circuit of FIG. 1 may input to each node an injection signal based on a difference between the input signal and an oscillation signal, thereby preventing generation of pulse signals at the edges of the toggle signal.

Figure 2:
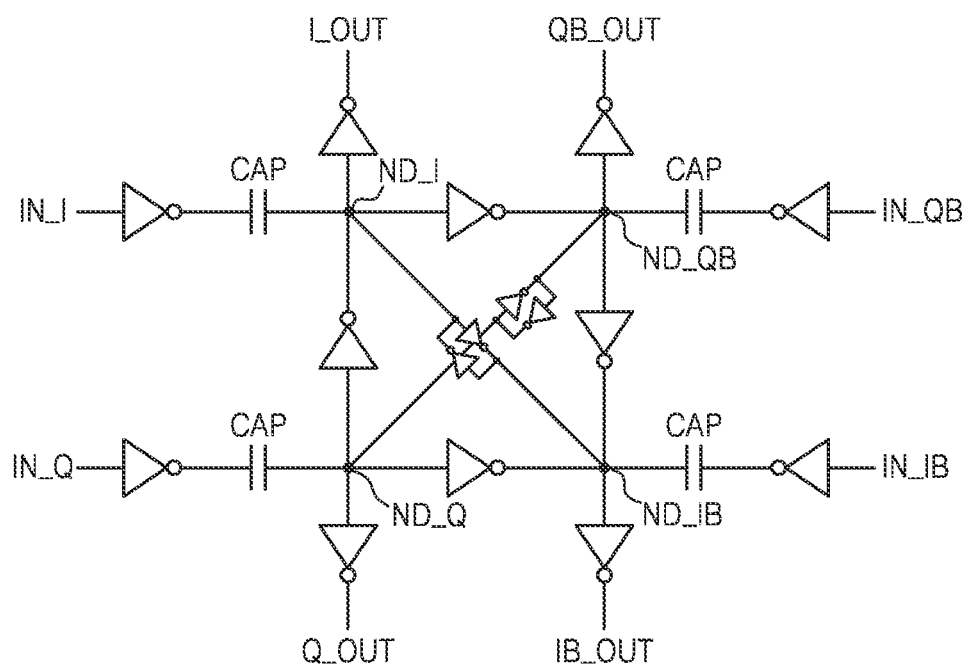
FIG. 2 is a circuit diagram illustrating a comparative injection locking oscillator circuit.

FIG. 2 is a circuit diagram illustrating a comparative oscillator circuit that may be considered as a comparative example in relation to the ILO circuit of FIG. 1.

Referring to FIG. 2, which assumes the poly-phase filter oscillator 21 is a quadrature oscillator, the comparative oscillator circuit receives multiple input signals (e.g., IN_I, IN_Q, IN_QB, and IN_IB) that are respectively injected at nodes of the poly-phase filter oscillator 21 via an inverter and a capacitor CAP. Here, the poly-phase filter oscillator 21 may generate a multiple of output signals (e.g., I_OUT, Q_OUT, QB_OUT, and IB_OUT) by synthesizing injection signals injected at respective nodes with oscillation signals generated in corresponding nodes.

Thus, when four input signals corresponding to the four nodes of the quadrature oscillator are applied, the input signals IN_I, IN_Q, IN_QB, and IN_IB may be respectively injected at nodes ND_I, ND_Q, ND_QB, and ND_IB via an inverter and the capacitor CAP. The injected signals may result from injection currents respectively generated using the capacitor CAP. An oscillation signal generated using inverter elements inside the quadrature oscillator and an injection signal may be synthesized with each other at each node. Oscillation signals generated at each node may be signals that maintain an accurate quadrature phase difference with respect to neighboring nodes via the inverter elements. Accordingly, signals obtained by synthesizing an injection signal with an oscillation signal at each node may be signals fixed to a quadrature phase difference with respect to neighboring nodes. The comparative oscillator circuit may generate the signals obtained by synthesizing, as output signals via an inverter, and provide the output signals via comparative oscillator circuit. As each output signal is generated using an inverter element from a signal obtained by synthesizing, the output signals generated at each node may also maintain a quadrature phase difference with respect to neighboring nodes.

Figure 3:
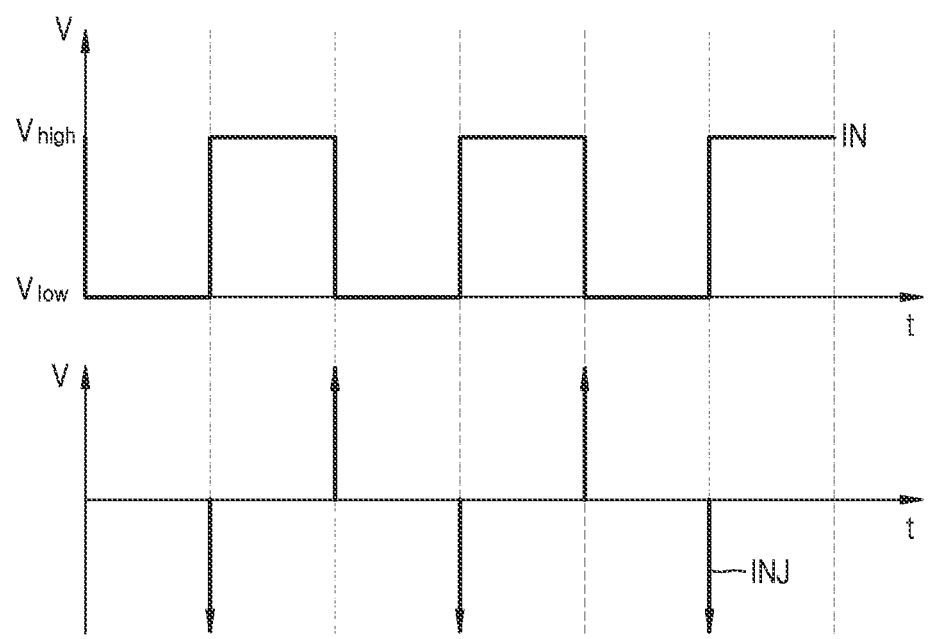
FIG. 3 is a graph illustrating a toggle signal as an input signal to the comparative example of FIG. 2 and pulse signals injected into an oscillator in response to the input signal.

FIG. 3 is a graph further illustrating a toggle signal that may be applied as an input signal to the comparative oscillator circuit of FIG. 2.

Referring to FIG. 3, the toggle signal may be characterized by a defined signal period, a logic-high voltage level $V_{HIGH}$ (hereafter, a "high") and a logic-low voltage level $V_{LOW}$ (hereafter, a "low").

In this regard, each of the input signals applied to the comparative oscillator circuit may be toggle signals having a phase difference with respect to an input signal applied to a neighboring node. However, because inputs signals applied as an external clock signal are applied via different signal transmission paths, differing delays may be generated, thereby causing and signal skewing among the input signals. As a result, although input signals applied to a quadrature oscillator may having a carefully defined quadrature phase difference, signal skewing may nonetheless arise between respective signals, and thus the quadrature phase difference may not be maintained.

Therefore, recognizing that the comparative oscillator circuit of FIG. 2 will generate injection signals based on the toggle signal of FIG. 3 applied as an input signal, when direct current (DC) signals are applied through a capacitor, no injection signal may be generated, and pulse signals may be generated as injection signals only at the edges of the toggle signal.

Figure 4A:
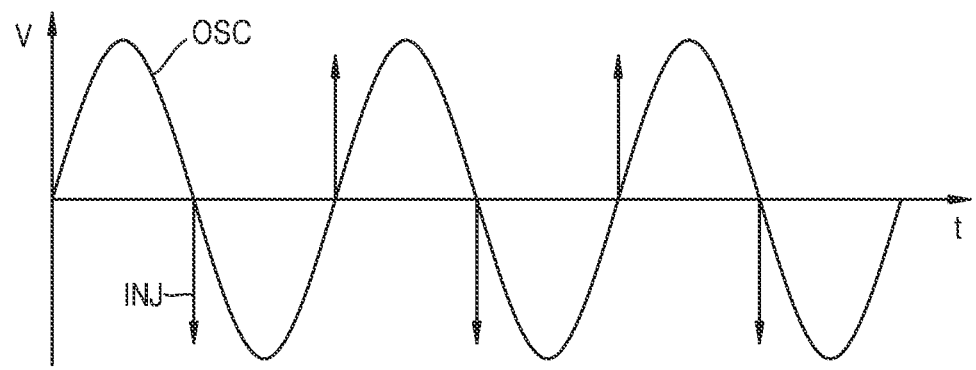
FIG. 4A is a graph illustrating an idealized oscillation signal and synchronized pulse signals.

FIG. 4A is a graph illustrating an idealized oscillation signal as well as corresponding, transition-synchronized pulse signals. In comparative contrast, FIG. 4B is a graph illustrating the same oscillation signal corrupted by noise that may arise due to the conditions described above.

Figure 4B:
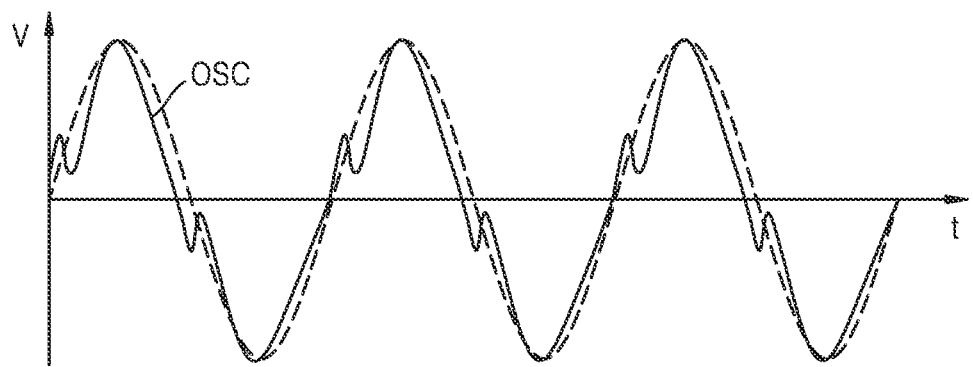
FIG. 4B is a graph illustrating an example in which the oscillation signal is corrupted with noise due to pulse signals.

Referring to FIGS. 4A and 4B, an ILO is assumed to generate an oscillation signal OSC at each node of FIG. 2 in response to an applied injection signal INJ. That is, the ILO may synthesize the oscillation signal OSC with the injection signal INJ. As illustrated in FIG. 4A, the oscillation signal OSC and the injection signal INJ may be properly synchronized after a defined period has passed following application of the injection signal INJ. That is, after a define period of time following application of an externally provided input signal, injection signals INJ applied to respective nodes may be maintained according to a fixed phase difference with respect to neighboring nodes.

However, referring to FIG. 4B, injection signals INJ may be continuously applied following the synchronization of the injection signal INJ with the oscillation signal OSC, yet noise may be generated in the oscillation signal OSC due to the injection signal INJ. That is, when a pulse signal is applied to each node, each pulse signal may pull-down or pull-up the oscillation signal OSC, and due to the pulling down/up, noise may be generated in a signal obtained by synthesizing the injection signal INJ with the oscillation signal OSC. The noise may form sub-peaks in the signal obtained by the synthesizing, and due to the sub-peaks, the ILO may generate distorted output signal(s).

Thus, when an injection signal INJ is applied to the comparative oscillator circuit of FIG. 2 via a capacitor, due to an abrupt energy transfer at a clock edge, the injection signal INJ and the oscillation signal OSC may not be properly synthesized, thereby causing a glitch and/or a jitter component in one or more output signals.

Embodiments of the inventive concept provide ILO circuits receiving toggle signal as an input signal that avoid generation of undesired pulse signals signal skewing among input signals. Accordingly, embodiments of the inventive concept provide ILO circuits that so not generate distorted output signals, but instead provide output signals having to a fixed phase difference with respect to output signals apparent at neighboring nodes.

Figure 5:
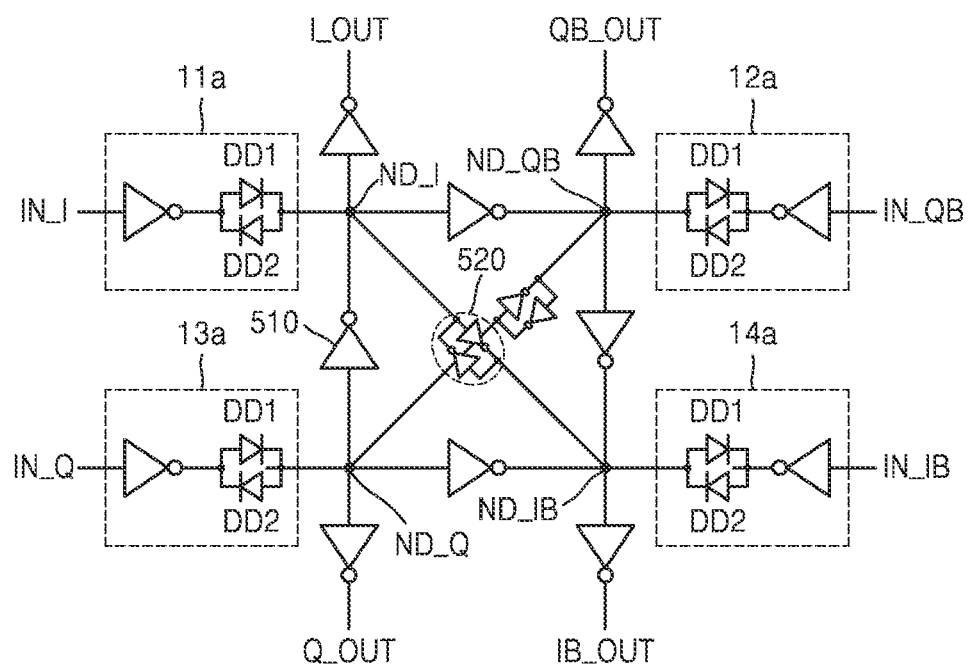
FIGS. 5, 10 and 11 are respective circuit diagrams illustrating various injection locking oscillator circuits according to embodiments of the inventive concept.

FIG. 5 is a circuit diagram illustrating an injection locking oscillator (ILO) circuit according to embodiments of the inventive concept.

Referring to FIG. 5, the ILO circuit is assumed to receive input signals IN_I, IN_Q, IN_QB, and IN_IB via four input terminals, although those skilled in the art will understand that the inventive concept is not limited to only this example. The input signals applied through the four input terminals may be signals having a quadrature phase difference with respect to other input signals applied via neighboring input terminals. However, as a skew component may be included in a phase difference among the input signals, the input signals may fail to maintain an accurate quadrature phase difference. For example, a phase difference between a first input signal IN_I applied to a first input terminal and a second input signal applied to a second input terminal IN_Q and a fourth input signal applied a fourth input terminal IN_QB may include a skew component relative to a quadrature phase difference.

The ILO circuit of FIG. 5 may receive a clock signal toggling according to a defined period, from each input terminal, as an input signal. For example, the input signals may be toggle signals generated based on a clock signal received from an external source (e.g., a host device) or four signals generated by delaying clock signals received from the external source according to a quadrature phase.

Injection circuits 11a, 12a, 13a, and 14a of the ILO circuit receive the input signals, and may provide an injection signal at each node (e.g., ND_I, ND_Q, ND_QB, and ND_IB) of the poly-phase signal output circuit 20 based on each of the input signals. Here, the injection circuits 11a, 12a, 13a, and 14a may include at least two diodes (DD1 and DD2), wherein each diode (DD1 and DD2) may be connected in parallel to have different polarities.

Thus, the diode DD may transfer current from an input terminal of the diode DD to an output terminal of the diode DD in response to a voltage level difference between the input terminal and the output terminal of the diode DD—the voltage level difference being greater than or equal to a threshold voltage level. The diode DD may block transfer of a current in this regard when a voltage level difference between the input terminal and the output terminal of the diode DD1 and DD2 is less than the threshold voltage level. That is, the injection circuits 11a, 12a, 13a, and 14a may determine whether to allow current flow and corresponding voltage development in relation to the input terminal and the output terminal of the diode DD1 and DD2 based on a difference between an input signal voltage level and a voltage level at each node.

For example, in the injection circuits 11a, 12a, 13a, and 14a, when an input signal having a voltage level exceeds a voltage level of an oscillation signal at each node by at least a threshold voltage, a first diode DD1 may be activated to output, as an injection signal, a signal having a level proportional to a difference between an input signal level and an oscillation signal level. Also, in the injection circuits 11a, 12a, 13a, and 14a, when a voltage level of the oscillation signal exceeds the voltage level of an input signal by at least a threshold voltage, a second diode DD2 may be activated to output, as the injection signal, a signal having a level proportional to a difference between an input signal level and an oscillation signal level. On the other hand, when a voltage difference between an oscillation signal and an input signal is less than the threshold voltage, the injection circuits 11a, 12a, 13a, and 14a may block output of an injection signal by inactivating both the first diode DD1 and the second diode DD2.

The injection circuits 11a, 12a, 13a, and 14a may inject injection signals to respective nodes of the poly-phase signal output circuit 20, and the poly-phase signal output circuit 20 may synchronize the injection signal with an oscillation signal by synthesizing the injection signal with the oscillation signal. The poly-phase signal output circuit 20 may determine a frequency of an oscillation signal to correspond to a frequency of an injection signal, and may maintain an accurate phase difference of signals obtained by synthesizing, among neighboring nodes, based on inverter elements connected between nodes of the poly-phase filter oscillator 21.

Referring to FIGS. 1 and 5, the poly-phase filter oscillator may be a quadrature oscillator, and an external circulation inverter 510 may be located between neighboring nodes, and an internal cross inverter 520 may be located between opposite nodes. Referring to the circuit diagram of FIG. 5, nodes arranged in a square shape are illustrated for convenience of description. However, embodiments of the inventive concept are not limited thereto and may include any device arrangement in which the external circulation inverter 510 is arranged between nodes having a quadrature phase difference and the internal cross inverter 520 is arranged between nodes having an inverted phase difference.

The external circulation inverter 510 may delay a signal by a quadrature phase difference by delaying an input/output operation, and output an inverted signal, and the internal cross inverter 520 may maintain a 180° phase difference by intensely maintaining an inverted state of an input/output voltage. That is, while voltage potentials of a first node and a third node, or voltage potentials of a second node and a fourth node transition to an opposite phase via the internal cross inverter 520, they are offset with a signal that has passed through two external circulation inverters 510. Thus, the poly-phase filter oscillator need not have a voltage fixed to each node, and may generate a signal that is delayed by a quadrature phase difference, as compared with neighboring nodes.

The poly-phase signal output circuit 20 may synchronize an injection signal with an oscillation signal based on a signal obtained by synthesizing and then output a signal fixed to a defined phase difference with respect to neighboring nodes, from each node. For example, the poly-phase signal output circuit 20 may generate a synchronized oscillation signal as an output signal using a buffer. However, the output signal is not limited thereto and may also be a toggle signal having a same (or similar) form as a clock signal applied as an input signal, or may be an output signal for which an accurate phase difference is maintained with respect to a toggle signal output from a neighboring node. Here, with respect to the poly-phase filter oscillator 21 of the poly-phase signal output circuit 20, each node may output a signal that oscillates while maintaining a quadrature phase difference with respect to a signal of neighboring nodes as inverters are connected between the four nodes, as illustrated in FIG. 5. However, a circuit of the poly-phase filter oscillator 21 is not limited to only the example illustrated in FIG. 5, but may include any type of oscillator in which each of the nodes outputs a signal having a well-maintained phase difference with respect to signals output at neighboring nodes.

It follows that ILO circuits according to embodiments of the inventive concept may remove a skew component with respect to input signals of neighboring nodes, included in input signals, based on injection signals generated from the input signals. After synchronization, as no pulse component arising because of a toggle signal is generated, ILO circuits according to embodiments of the inventive concept prevent noise due to an abrupt edge and generate stable output signal(s).

Figure 6:
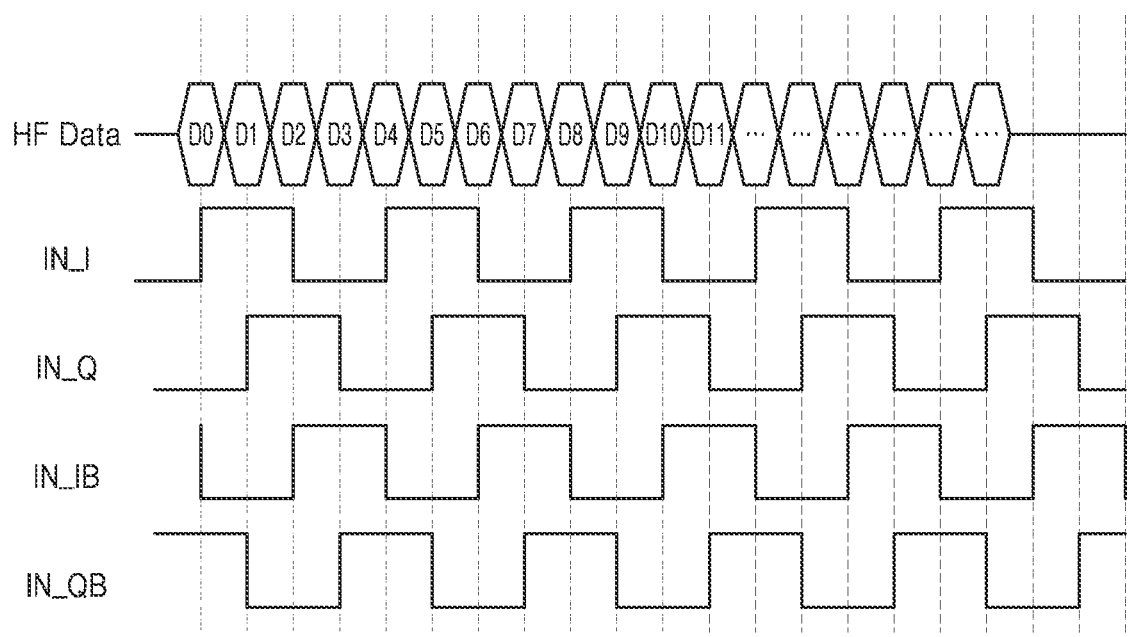
FIG. 6 is a waveform diagram illustrating input signals applied to an injection locking oscillator circuit according to embodiments of the inventive concept.

FIG. 6 is a waveform diagram further illustrating the input signals applied to the ILO circuit of FIG. 5.

Referring to FIG. 6, a poly-phase clock having a uniform quadrature phase difference may be used as a clock associated with the communication (e.g., transmission and/or reception) of high-frequency data. Multiple clocks IN_I, IN_Q, IN_IB, and IN_QB generated in relation to the ILO circuit may be used to generate, communicate and or store/retrieve data at clock transition times (e.g., transition edges from low-to-high and/or high-to-low). In this context, high-frequency data may be input and/or output according to a defined quadrature phase difference. For example, zeroth, fourth, eighth, and 4n-th ('n' being a natural number) data components D0, D4, D8, and D4n may be transmitted or received via a first clock signal IN_I, and first, fifth, ninth, and (4n+1)th data components D1, D5, D9, and D(4n+1) may be transmitted or received via a second clock signal IN_Q. Likewise, second, sixth, tenth, and (4n+2)th data components D2, D6, D10, and D(4n+2) may be transmitted or received via a third clock signal IN_IB, and third, seventh, eleventh, and (4n+3)th data components D3, D7, D11, and D(4n+3) may be transmitted or received via a fourth clock signal IN_QB.

In many integrated circuit (IC) devices processing high-frequency data, a clock having a frequency the same as the frequency of the data being processed is required. However, by using multiple clocks having an identical phase difference, a rate of a clock may be reduced with respect to data according to the number of clocks, and accordingly, the IC device may operate internal elements at a relatively lower rate.

Figure 7:
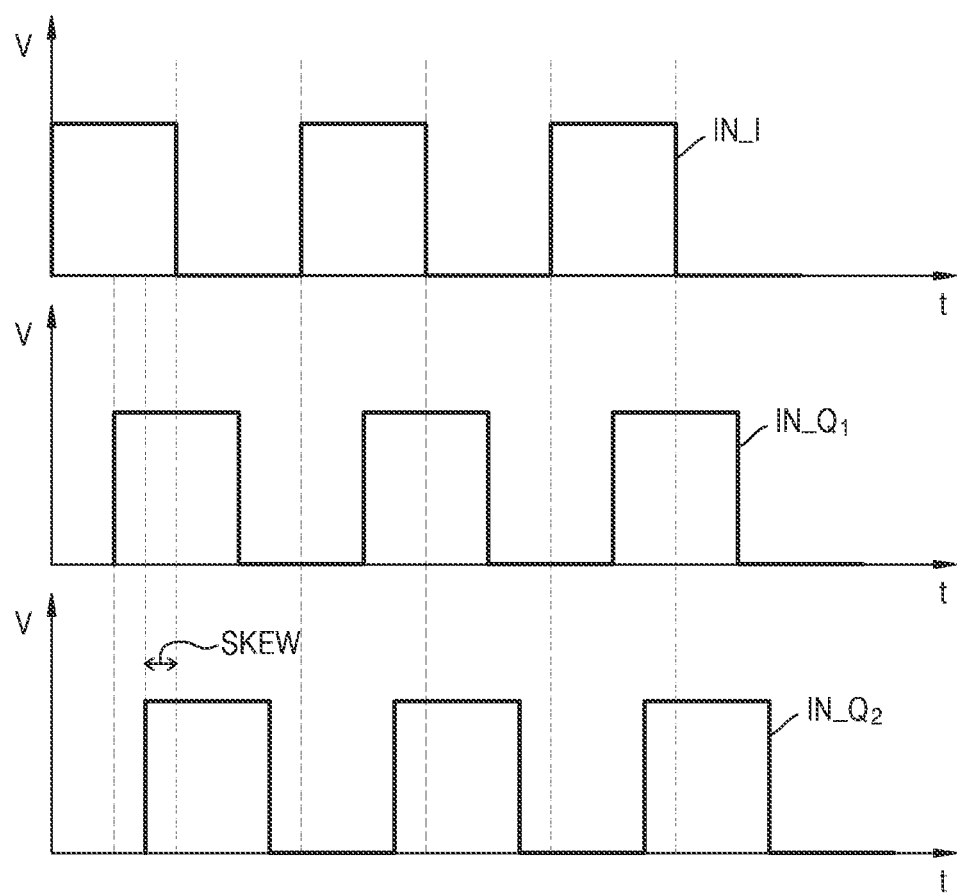
FIG. 7 is a graph illustrating an input signal including a skew component in the context of an embodiment of the inventive concept.

FIG. 7 is a graph illustrating an input signal including a skew component.

Referring to FIG. 7, clock signals generated using a poly-phase signal generator are applied to an ILO circuit, and as the clock signals being applied are applied to the ILO via different transmission paths, a skew component with respect to a phase difference among the clock signals may be included in the clock signals. For example, when an input signal applied to each node is set to have a quadrature phase difference with respect to an input signal applied to an adjacent node, a phase difference between a first input signal IN_1 and a second input signal IN_$Q_1$ is to be a quadrature phase difference. However, when a skew component is generated, the second input signal IN_$Q_2$ may not be applied from the first input signal IN_I, with an accurate quadrature phase difference.

In real world applications, the skew component with respect to the phase difference may become a factor in reducing a timing margin relative to an optimum point in time (a timing window) for processing data. Referring to FIG. 6, when a first clock signal latches a data component at a maximum margin point and clock signals have a uniform phase difference, a second clock signal, a third clock signal and a fourth clock signals, which are subsequent to the first clock signal, may automatically latch a data component at the maximum margin point. On the other hand, when a skew component is generated in a clock signal, a data component may not be latched at the maximum margin point. Further, when the skew component accumulates, a data component may be latched during subsequent periods at a gradually reduced (or increasingly less optimal) margins.

Referring to FIG. 5, as input signals including a skew component are applied to the ILO circuit, the ILO circuit may generate an output signal having a phase difference among other output signal that is fixed according to a defined phase difference. An associated IC device may latch data components accurately at a maximum margin point by latching the data components based on an output signal for which a phase difference remains properly fixed, and may therefore adaptively remove skew component(s) that is repeated and/or unpredictable.

Figure 8:
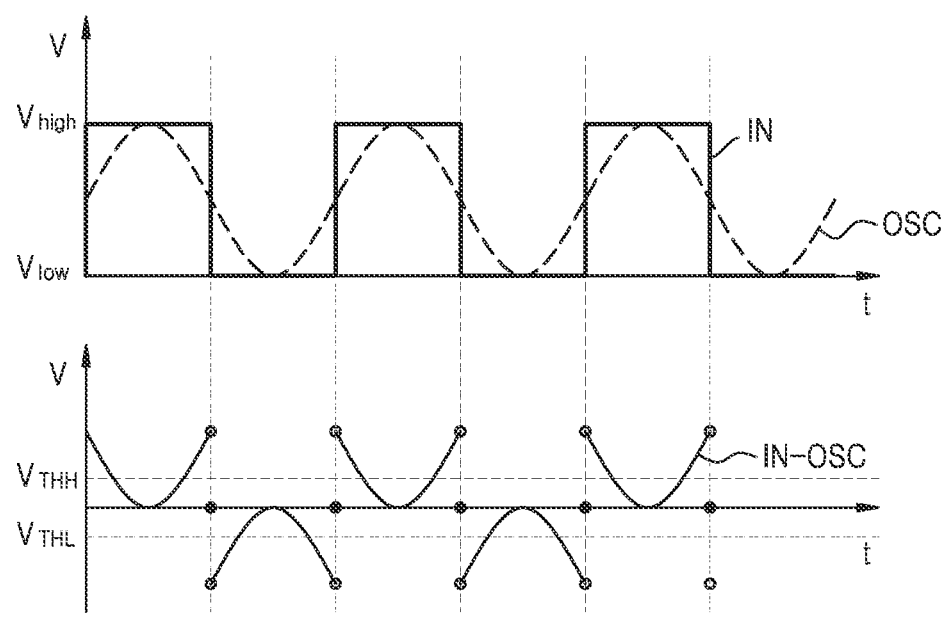
FIG. 8 is a graph illustrating a difference between an input signal at an input terminal of an injection circuit and an oscillation signal of an output terminal of the injection circuit.
Figure 9:
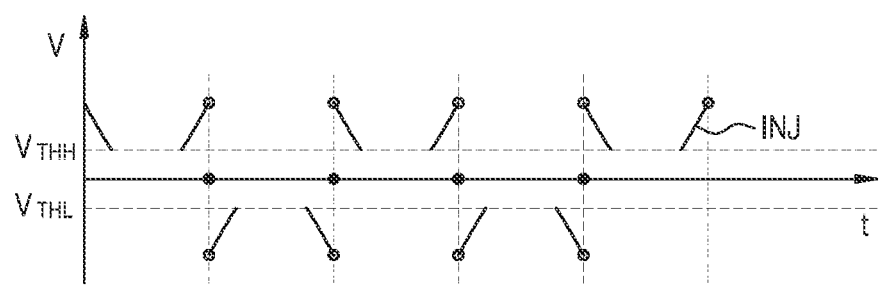
FIG. 9 is a graph illustrating an injection signal according to embodiments of the inventive concept which is generated based on a difference between an input signal and an oscillation signal.

FIG. 8 is a graph illustrating a difference between an input signal IN at an input terminal of the injection circuit 10 and an oscillation signal OSC at an output terminal of the injection circuit 10. FIG. 9 is a graph illustrating an injection signal INJ generated based on the difference between the input signal IN and the oscillation signal OSC.

Referring to FIG. 8, when the ILO circuit has synchronized an oscillation signal OSC generated in each node with an input signal IN, a period of the oscillation signal OSC may correspond to that of the input signal IN. The injection circuit 10 of the ILO circuit may determine whether to output or block the injection signal INJ based on a difference IN-OSC between an input signal and an oscillation signal.

Referring to FIG. 9, the injection circuit 10 may block output of the injection signal INJ when a voltage level difference $V_{in}$-$V_{osc}$ between the input signal IN and the oscillation signal OSC of FIG. 8 is less than a threshold voltage level. When the voltage level difference $V_{in}$-$V_{osc}$ is equal to or greater than the threshold voltage level, the injection circuit 10 may output the injection signal INJ. In FIG. 9, while a voltage level of the injection signal INJ is illustrated to be a voltage level difference between the input signal IN and the oscillation signal OSC, the inventive concept is not limited thereto, and a voltage level of the injection signal INJ may correspond to a voltage level difference between the input signal IN and the oscillation signal OSC.

Referring to the comparative oscillator circuit of FIG. 2, when a signal that abruptly rises or falls to/from a voltage of a complementary metal oxide semiconductor (CMOS) level is input to the ILO circuit, due to a voltage or current level close to a pulse signal, a glitch may be caused in the oscillation signal OSC. However, according to the ILO circuit of FIG. 9, a signal is continuously applied over a wider time period than the comparative example of FIGS. 2 and 3, and there is a point in time when voltage levels of the oscillation signal OSC and the input signal IN equal each other at a time point where the signal abruptly transitions. Thus, the injection circuit 10 may block input of a signal that causes a glitch.

Figure 10:
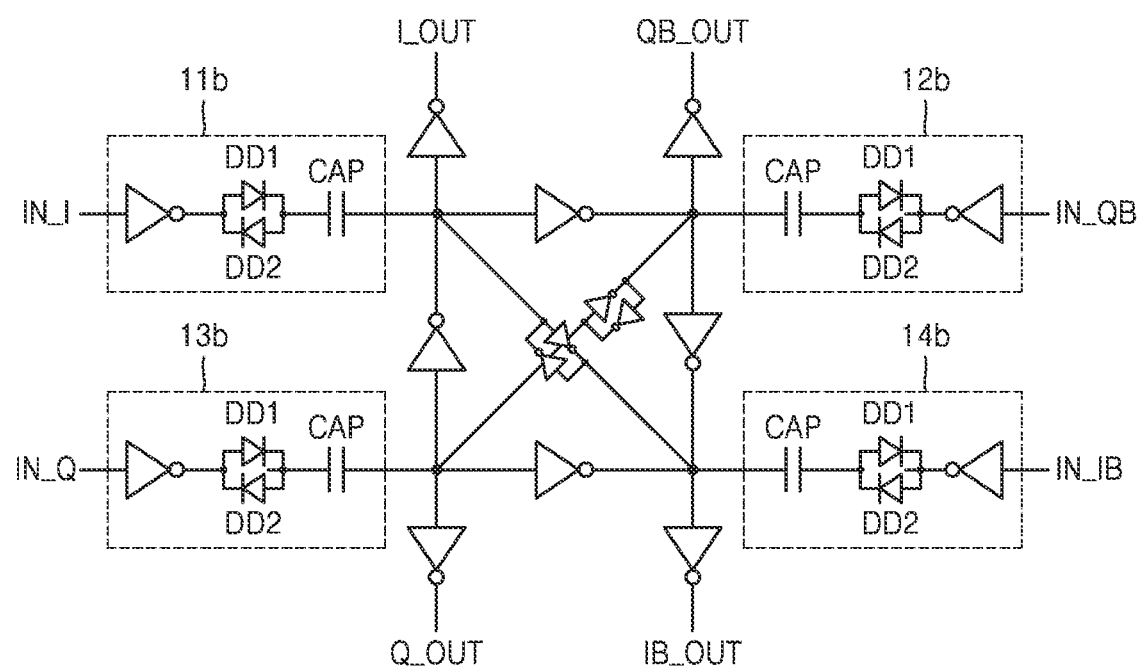
Figure 11:
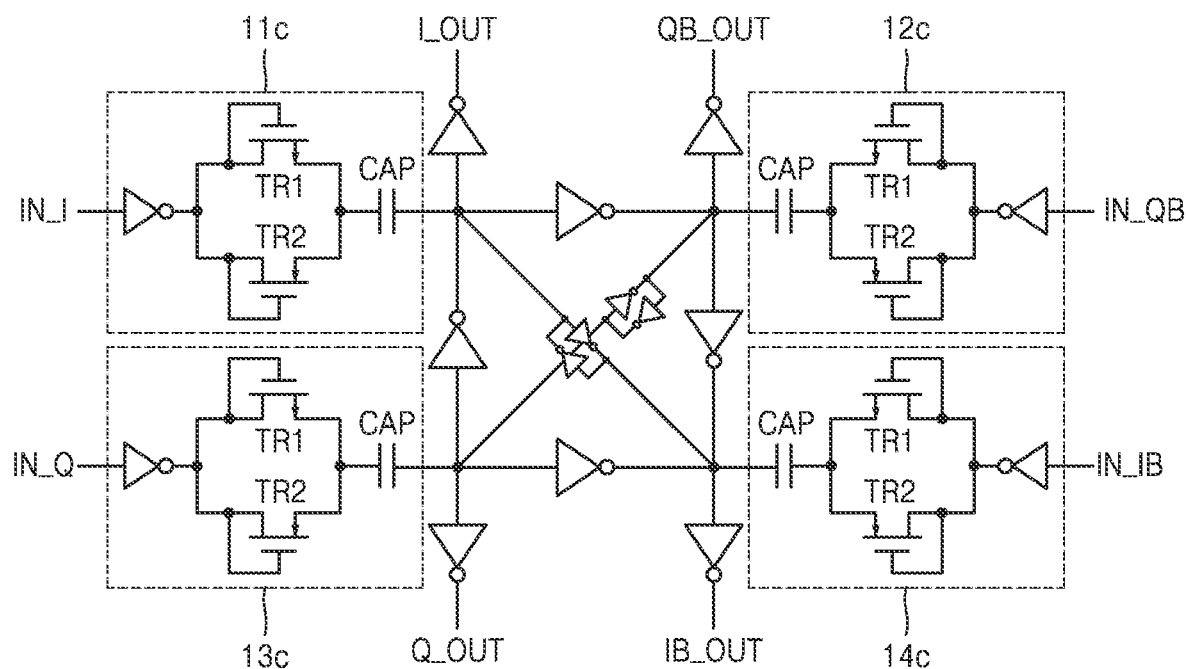

FIGS. 10 and 11 are respective circuit diagrams further illustrating in other examples the circuits 11a, 12a, 13a, and 14a of FIG. 5 according to embodiments of the inventive concept.

Referring to FIGS. 1, 5 and 10, analogous injection circuits 11b, 12b, 13b, and 14b according to FIG. 10 may include a first diode DD1, a second diode DD2 and a capacitor CAP. A first end of the capacitor CAP may be connected to output terminals of the first diode DD1 and the second diode DD2 that are connected in parallel, and a second end of the capacitor CAP may be connected to an input terminal of the poly-phase filter oscillator 21. Accordingly, the capacitor CAP may remove a DC component from an output signal of the first diode DD1 or the second diode DD2 but transfer an alternating current (AC) component of the output signal to each node, and may generate an injection signal having a mono-tone frequency from the output signal of the first diode DD1 or the second diode DD2.

Referring to FIGS. 1, 5 and 11, injection circuits 11c, 12c, 13c, and 14c according to FIG. 11 may include a first transistor TR1 and a second transistor TR2 connected in parallel, and a capacitor CAP connected to output terminals of the first and second transistors TR1 and TR2. However, the embodiment of FIG. 11 is not limited thereto, and the injection circuits 11c, 12c, 13c, and 14c may not include the capacitor CAP, and the output terminals of the first transistor TR1 and the second transistor TR2 may be connected to each node.

The first transistor TR1 and the second transistor TR2 may be transistors having different polarities; for example, when the first transistor TR1 may be a PMOS transistor, the second transistor TR2 may be an NMOS transistor. As a gate terminal and a drain terminal of each transistor may be connected to an input terminal of the injection circuits 11c, 12c, 13c, and 14c, and a source terminal of each transistor may be connected to an output terminal of the injection circuit 10, each transistor may be activated when a voltage difference between the gate terminal and the source terminal of the transistor is equal to or higher than a threshold voltage. That is, when voltage levels of an input signal and an oscillation signal are equal to or higher than the threshold voltage, the injection circuits 11c, 12c, 13c, and 14c may output an injection signal proportional to a voltage level difference between the input signal and the oscillation signal.

Figure 12:
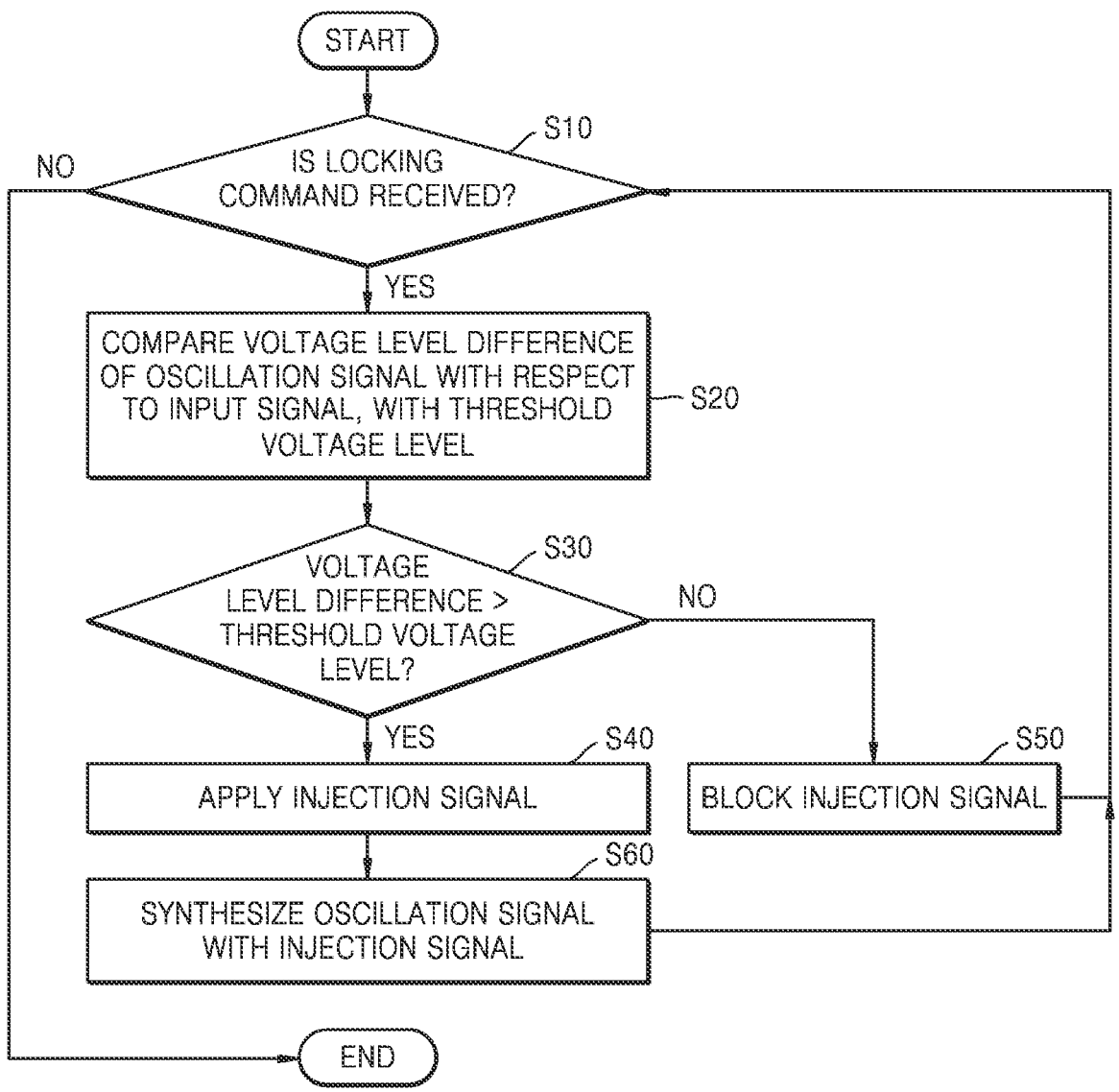
FIG. 12 is a flowchart summarizing an operating method for an injection locking oscillator according to embodiments of the inventive concept.

FIG. 12 is a flowchart summarizing an operating method for an ILO circuit according to embodiments of the inventive concept.

Referring to FIGS. 5 and 12, an ILO circuit may determine whether to apply an injection signal based on a level difference between an input signal and an oscillation signal. Here, the ILO circuit may determine whether to perform an injection locking operation based on whether a locking command is received from an external source (e.g., a host device or a controller device) (S10). A locking command may be a command signal directing whether the ILO circuit is to perform an injection locking operation. According to an embodiment, a controller device may determine whether to generate a locking command, based on a number or a nature (e.g., a level or degree) of skew components associated with input signals. For example, when the level of a skew component multiple input signals exceeds a threshold value, the controller device may transmit a locking command to the ILO circuit, but so long as the level of skew components remains below the threshold value, the controller device will not transmit a locking command to the ILO circuit.

That is, the ILO circuit may determine whether to be activated based on a number of skew components or a level of a skew component associated with various input signals. For example, when the controller device determines that the level of a skew component associated with input signals is not great, the controller device may instruct the ILO circuit not to perform an injection locking operation, thereby improving the efficiency of operating for the ILO circuit.

When the ILO circuit receives a locking command (S10=YES), the ILO circuit may compare a voltage level difference of an oscillation signal with respect to an input signal with a threshold voltage level (S20). Referring to FIG. 5, a voltage level difference between the input signal and the oscillation signal may correspond to a voltage difference between two ends of the first diode DD1 and a second diode DD2.

As a result of the foregoing comparison step (S20), the ILO circuit may determine whether the voltage level difference is greater than the threshold voltage level (S30).

If the voltage level difference is greater than the threshold voltage level (S30=YES), the ILO circuit may apply an injection signal corresponding to the voltage level difference between the input signal and the oscillation signal to a node in which the oscillation signal is generated (S40). Then, once an injection signal is applied to each node, the ILO circuit may synchronize the injection signal with the oscillation signal by synthesizing the oscillation signal with the injection signal (S60).

Otherwise, if the voltage level difference is not greater than the threshold voltage level (S30=NO), the ILO circuit blocks application of an injection signal to each node (S50).

While determining whether to apply or block an injection signal, the ILO circuit may continuously check whether a locking command is received, and when no locking command is received, the ILO circuit may end the locking operation.

Figure 13:
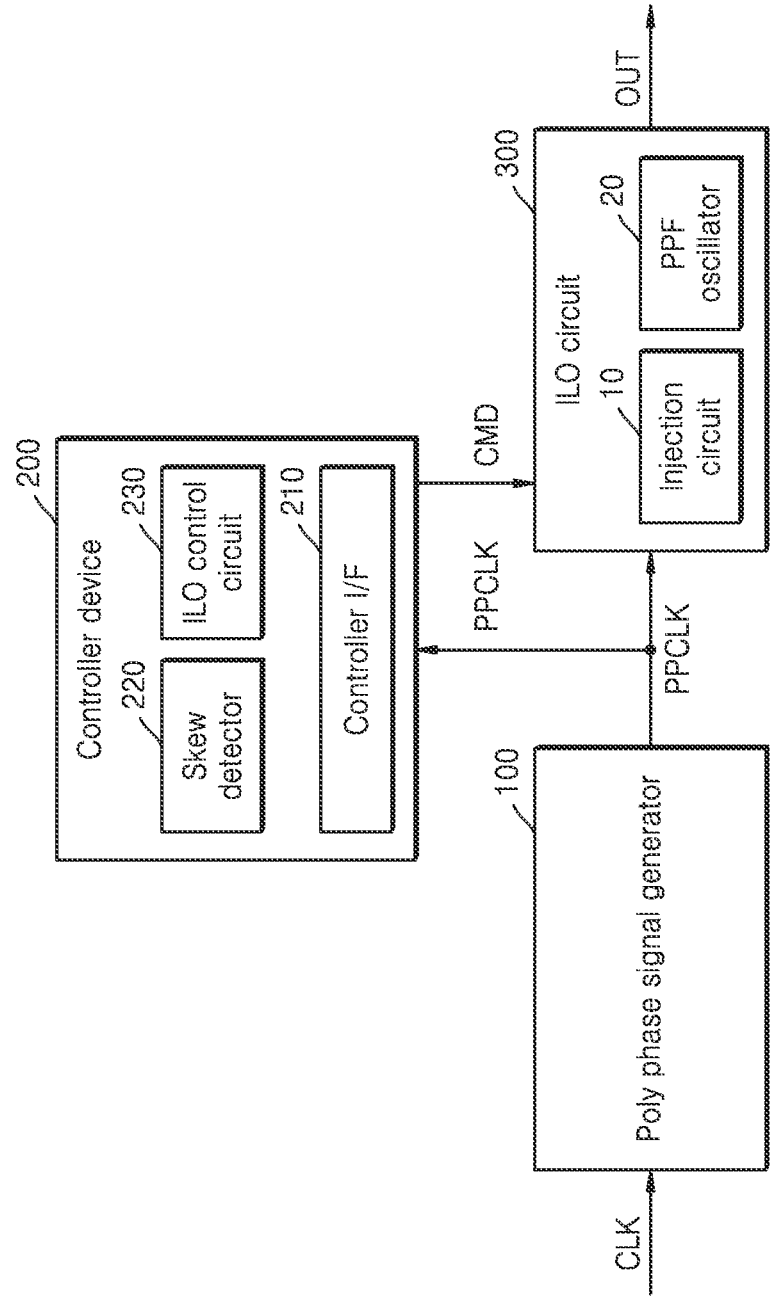
FIG. 13 is a block diagram illustrating an injection locking system according to embodiments of the inventive concept.

FIG. 13 is a block diagram illustrating an injection locking system according to embodiments of the inventive concept.

Referring to FIG. 13, the injection locking system may include a poly-phase signal generator 100, a controller device 200 and an ILO circuit 300. The poly-phase signal generator 100 may generate poly-phase clock signals (PPCLK) derived from a clock signal (CLK) received from an external source. Here, the clock signal may be a high-frequency clock signal used to latch data an IC device. The poly-phase signal generator 100 may generate the poly-phase clock signals, for example, by variously reducing the frequency of the high-frequency signal. While the poly-phase clock signals may be signals intended to have defined phase differences with respect to one another. However, the poly-phase clock signals may include one or more skew components due to (e.g.,) variations in the injection locking system, as described above. The poly-phase signal generator 100 may provide the poly-phase clock signals to the controller device 200 and the ILO circuit 300.

The controller device 200 may include a controller interface 210, a skew detector 220 and an ILO control circuit 230. The controller interface 210 may receive the poly-phase clock signals and provide a locking command (CMD) to the ILO circuit 300 in response to the poly-phase clock signals under the control of the ILO control circuit 230. The skew detector 220 may detect one or more skew components in the poly-phase clock signals received via the controller interface 210.

In this regard, a number and/or nature of skew components associated with the poly-phase clock signals may be provided by the skew detector 220 to the ILO control circuit 230, and the ILO control circuit 230 may determine whether to generate the locking command based on the number of skew components. For example, when a phase difference associated with one of the detected skew components exceeds a threshold phase difference, the ILO control circuit 230 may determine that the skew components should be removed, and may generate the locking command that causes an injection locking operation to be performed.

Referring to FIGS. 1 and 13, upon receiving the locking command, the ILO circuit 300 may perform an injection locking operation through the injection circuit 10 and the poly-phase filter oscillator 21. Accordingly, the ILO circuit 300 may provide output signals (OUT) having defined phase differences by performing an injection locking operation to an external device (e.g., an IC device latching data). Here, the ILO circuit 300 performing an injection locking operation may be consistent with an embodiment of the inventive concept, like those previously described in relation to FIGS. 1 through 12.

While the inventive concept has been particularly shown and described with reference to example embodiments thereof, it will be understood that various changes in form and details may be made therein without departing from the spirit and scope of the following claims.

What is claimed is:

1. An injection locking oscillator (ILO) circuit, comprising:
   an injection circuit configured to receive input signals having a phase difference relative between the input signals and provide injection signals respectively corresponding to the input signals based on a voltage level difference between each input signal and an oscillation signal; and
   a poly-phase signal output circuit configured to output poly-phase output signals having a defined phase difference between the output signals in response to the injection signals,
   wherein the injection circuit is further configured to provide as an injection signal, among the injection signals, having a level proportional to a difference between an input signal, among the input signals, and an oscillation signal, if the difference between the input signal and the oscillation signal is greater than or equal to a threshold voltage.

2. The ILO circuit of claim 1, wherein the poly-phase signal output circuit comprises a poly-phase filter (PPF) oscillator configured to generate oscillation signals having the defined phase difference between the output signals and to synthesize the injection signals with the oscillation signals.

3. The ILO circuit of claim 2, wherein the PPF oscillator is further configured to generate the oscillation signals at input terminals, and to fix a phase difference between the injection signals to a phase difference between the oscillation signals.

4. The ILO circuit of claim 1, wherein the injection circuit is further configured to block providing of the injection signal when the difference between the input signal and the oscillation signal is less than the threshold voltage.

5. The ILO circuit of claim 1, wherein the injection circuit comprises:
   a first diode connected between an input terminal and an output terminal of the injection circuit; and
   a second diode connected in parallel with the first diode, and connected between the input terminal and the output terminal of the injection circuit in an opposite polarity direction with respect to the first diode.

6. The ILO circuit of claim 5, wherein one of the first diode and the second diode is activated in response to a difference between the input signal and the oscillation signal, if the difference between the input signal and the oscillation signal is greater than or equal to a threshold voltage.

7. The ILO circuit of claim 5, wherein the injection circuit further comprises:
   a capacitor serially connected to a parallel combination of the first diode and the second diode.

8. The ILO circuit of claim 1, wherein the injection circuit comprises:
   a first transistor having a gate terminal and a drain terminal connected to an input terminal of the injection circuit and a source terminal connected to an output terminal of the injection circuit; and
   a second transistor having a gate terminal and a drain terminal connected to the input terminal of the injection circuit in parallel with the first transistor and a source terminal connected to the output terminal of the injection circuit in parallel with the first transistor, wherein the second transistor has a different polarity from the first transistor.

9. The ILO circuit of claim 8, wherein one of the first transistor and the second transistor is activated in response to a difference between the input signal and the oscillation signal, if the difference between the input signal and the oscillation signal is greater than or equal to a threshold voltage.

10. A quadrature skew compensation circuit comprising:
    a quadrature oscillator configured to generate oscillation signals having different phases and respectively provide the oscillation signals at nodes, such that each node provides an oscillation signal orthogonal to a different oscillation signal provided at a neighboring node; and an injection circuit configured to receive input signals respectively corresponding to the nodes and output injection signals to the respective nodes based on a voltage level difference between the oscillation signal of each node and the input signals, wherein the injection circuit comprises:

a first diode connected between an input terminal and an output terminal of the injection circuit; and a second diode connected in parallel with the first diode, and connected between the input terminal and the output terminal in an opposite polarity direction with respect to the first diode.

11. The quadrature skew compensation circuit of claim 10, wherein the quadrature oscillator fixes a phase difference with respect to the injection signals provided at the neighboring node to a quadrature phase difference, based on a quadrature phase difference with respect to the neighboring node.

12. The quadrature skew compensation circuit of claim 10, wherein the injection circuit provides, in response to a difference between the input signal and the oscillation signal, a signal having a voltage level proportional to the difference between the input signal and the oscillation signal as the injection signal.

13. The quadrature skew compensation circuit of claim 10, wherein the injection circuit comprises a capacitor serially connected to a parallel combination of the first diode and the second diode.

14. The quadrature skew compensation circuit of claim 10, wherein:

the first diode is a first transistor having a gate terminal and a drain terminal connected to an input terminal of the injection circuit and a source terminal connected to an output terminal of the injection circuit;

the second diode is a second transistor having a gate terminal and a drain terminal connected to the input terminal of the injection circuit in parallel with the first transistor and a source terminal connected to the output terminal of the injection circuit in parallel with the first transistor; and the second transistor has a different polarity than the first transistor.

15. An operating method for an injection locking oscillator (ILO), the operating method comprising:

injecting an injection signal to a first node based on a voltage level difference between an input signal corresponding to the first node and an oscillation signal generated in the first node;

synthesizing the oscillation signal with the injection signal in the first node; and outputting, from the first node, a signal having a fixed quadrature phase difference with respect to neighboring nodes of the first node based on a signal provided by synthesizing the oscillation signal with the injection signal, wherein the injecting of the injection signal comprises:

when the input signal is greater than the oscillation signal by at least a threshold voltage, inputting, as the injection signal, a signal having a voltage level proportional to a difference between a level of the input signal and a level of the oscillation signal as a first diode is activated;

when the oscillation signal is greater than the input signal by at least the threshold voltage, inputting, as the injection signal, a signal having a voltage level proportional to a difference between a level of the input signal and a level of the oscillation signal as a second diode is activated; and when a difference between the oscillation signal and the input signal is less than the threshold voltage, blocking the input signal as the first diode and the second diode are both inactivated.

16. The operating method of claim 15, wherein the injecting of the injection signal comprises outputting, in response to a difference between the input signal and the oscillation signal, a signal having a voltage level proportional to the difference between the input signal and the oscillation signal, as the injection signal, if the difference is greater than or equal to a threshold voltage.

17. The operating method of claim 15, wherein:

the first diode is a first transistor having a gate terminal and a drain terminal connected to an input terminal of an injection circuit and a source terminal connected to an output terminal of the injection circuit; and the second diode is a second transistor having a different polarity than the first transistor and having a gate terminal and a drain terminal connected to the input terminal in parallel with the first transistor and a source terminal connected to the output terminal in parallel with the first transistor.

* * * * *